(12) United States Patent
Limbeck et al.

(10) Patent No.: US 9,117,969 B2
(45) Date of Patent: Aug. 25, 2015

(54) THERMOELECTRIC DEVICE, THERMOELECTRIC APPARATUS HAVING A MULTIPLICITY OF THERMOELECTRIC DEVICES AND MOTOR VEHICLE HAVING A THERMOELECTRIC APPARATUS

(75) Inventors: Sigrid Limbeck, Much (DE); Rolf Brück, Bergisch Gladbach (DE)

(73) Assignee: EMITEC Gesellschaft fuer Emissionstechnologie mbH, Lohmar (DE)

( * ) Notice: Subject to any disclaimer, the term of this patent is extended or adjusted under 35 U.S.C. 154(b) by 262 days.

(21) Appl. No.: 13/026,437

(22) Filed: Feb. 14, 2011

(65) Prior Publication Data
US 2011/0185715 A1 Aug. 4, 2011

Related U.S. Application Data

(63) Continuation of application No. PCT/EP2009/060371, filed on Aug. 11, 2009.

(30) Foreign Application Priority Data

Aug. 13, 2008 (DE) .................... 10 2008 038 985

(51) Int. Cl.
*F01N 5/02* (2006.01)
*H01L 35/32* (2006.01)

(52) U.S. Cl.
CPC ............... *H01L 35/32* (2013.01); *F01N 5/025* (2013.01); *Y02T 10/16* (2013.01)

(58) Field of Classification Search
CPC .................. H01L 35/32; F01N 5/025
USPC .................... 60/275; 136/200–242
See application file for complete search history.

(56) References Cited

U.S. PATENT DOCUMENTS 3,035,109 A * 5/1962 Sheckler ................. 136/203
3,225,549 A * 12/1965 Elfving ................... 62/3.3

(Continued)

FOREIGN PATENT DOCUMENTS

| CN | 1093758 A | 10/1994 |
| CN | 1702185 A | 11/2005 |

(Continued)

OTHER PUBLICATIONS

International Search Report of PCT/EP2009/060371 Dated May 25, 2010.

*Primary Examiner* — Audrey K Bradley
*Assistant Examiner* — Brandon Lee
(74) *Attorney, Agent, or Firm* — Laurence A. Greenberg; Werner H. Stemer; Ralph E. Locher

(57) ABSTRACT

A thermoelectric device includes at least a first metal foil having a first material thickness, a second metal foil having a second material thickness, an interspace between the first metal foil and the second metal foil, an electrical insulation coating on the first metal foil and the second metal foil towards the interspace and a multiplicity of first semiconductor components and second semiconductor components, which are fixed and electrically connected to one another on the insulation coating in the interspace. A thermoelectric apparatus having a multiplicity of thermoelectric devices and a motor vehicle having a thermoelectric apparatus, are also provided.

8 Claims, 1 Drawing Sheet

(56) References Cited

U.S. PATENT DOCUMENTS

| | | | |
|---|---|---|---|
| 3,240,628 A | | 3/1966 | Sonntag |
| 3,416,223 A | | 12/1968 | Walz |
| 4,459,428 A | * | 7/1984 | Chou .......................... 136/211 |
| 4,650,919 A | | 3/1987 | Benson et al. |
| 6,098,396 A | * | 8/2000 | Wen et al. ...................... 60/777 |
| 6,274,803 B1 | | 8/2001 | Yoshioka et al. |
| 2005/0172993 A1 | | 8/2005 | Shimoji et al. |
| 2006/0005873 A1 | * | 1/2006 | Kambe et al. ................. 136/211 |
| 2006/0157102 A1 | | 7/2006 | Nakajima et al. |
| 2006/0179819 A1 | | 8/2006 | Sullivan |
| 2008/0079109 A1 | * | 4/2008 | Luo .............................. 257/470 |

FOREIGN PATENT DOCUMENTS

| | | |
|---|---|---|
| DE | 3527673 A1 | 2/1986 |
| DE | 10022726 C2 | 6/2001 |
| DE | 10 2005 005 077 A1 | 9/2005 |
| DE | 10 2006 037 540 A1 | 2/2007 |
| DE | 10 2006 039 024 A1 | 2/2008 |
| JP | 11055973 A | 2/1999 |
| JP | 2008035595 A | 2/2008 |
| WO | 2005/109535 A2 | 11/2005 |
| WO | 2007026432 A1 | 3/2007 |

* cited by examiner

THERMOELECTRIC DEVICE, THERMOELECTRIC APPARATUS HAVING A MULTIPLICITY OF THERMOELECTRIC DEVICES AND MOTOR VEHICLE HAVING A THERMOELECTRIC APPARATUS

CROSS-REFERENCE TO RELATED APPLICATION

This is a continuation, under 35 U.S.C. §120, of copending International Application No. PCT/EP2009/060371, filed Aug. 11, 2009, which designated the United States; this application also claims the priority, under 35 U.S.C. §119, of German Patent Application DE 10 2008 038 985.4, filed Aug. 13, 2008; the prior applications are herewith incorporated by reference in their entirety.

BACKGROUND OF THE INVENTION

Field of the Invention

The present invention relates to a device for generating electrical energy e.g. from the exhaust gas of an internal combustion engine through the use of a generator. The generator is understood to mean, in particular, a generator for converting thermal energy of an exhaust gas into electrical energy, that is to say a so-called thermoelectric generator. The invention also relates to a thermoelectric apparatus having a multiplicity of thermoelectric devices and a motor vehicle having a thermoelectric apparatus.

The exhaust gas from an engine of a motor vehicle has thermal energy, which can be converted into electrical energy through the use of a thermoelectric generator or apparatus in order, for example, to fill a battery or some other energy storage device or to directly feed required energy to electrical loads. Energy is thus available to a greater extent for the operation of the motor vehicle.

Such a thermoelectric generator includes at least a plurality of thermoelectric converter elements. Thermoelectric materials are of such a type that they can effectively convert thermal energy into electrical energy (Seebeck effect), and vice versa (Peltier effect). The "Seebeck effect" is based on the phenomenon of the conversion of thermal energy into electrical energy and is utilized for generating thermoelectric energy. The "Peltier effect" is the reverse of the Seebeck effect and a phenomenon which is accompanied by heat adsorption and is caused in relation to a current flow through different materials. The Peltier effect has already been proposed for thermoelectric cooling, for example.

Such thermoelectric converter elements preferably have a multiplicity of thermoelectric elements positioned between a so-called "hot side" and a so-called "cold side." Thermoelectric elements include e.g. at least two semiconductor parallelepipeds (p-doped and n-doped) which are alternately connected to electrically conductive bridges on their upper side and lower side (respectively toward the "hot side" and "cold side"). Ceramic plates or ceramic coatings and/or similar materials serve for insulating the metal bridges and are therefore preferably disposed between the metal bridges. If a temperature gradient is provided on the two sides of the semiconductor parallelepipeds, then a voltage potential forms. On one contact location, heat is absorbed in this case ("hot side"), wherein the electrons of one side pass to the energetic higher conduction band of the following parallelepiped. On the other side, the electrons can liberate energy in order to again pass to the other side with a lower energy level ("cold side"). Consequently, a current flow can be established given a corresponding temperature gradient.

It has already been attempted to provide corresponding thermoelectric generators for application in motor vehicles, in particular passenger cars. However, they have mainly been very expensive to produce and distinguished by a relative low efficiency. Therefore, it has not yet been possible to attain suitability for series production. Moreover, it has been possible to determine that the known thermoelectric generators usually demand very large structural space and can therefore only be integrated into existing exhaust gas systems with difficulty.

SUMMARY OF THE INVENTION

It is accordingly an object of the invention to provide a thermoelectric device, a thermoelectric apparatus having a multiplicity of thermoelectric devices and a motor vehicle having a thermoelectric apparatus, which overcome the hereinafore-mentioned disadvantages and at least partly solve the highlighted problems of the heretofore-known devices, apparatuses and vehicles of this general type. In particular, the intention is to specify a thermoelectric device which enables an improved efficiency with regard to the conversion of available thermal energy into electrical energy, copes with changing stresses in the exhaust gas system of mobile internal combustion engines and is constructed very compactly.

With the foregoing and other objects in view there is provided, in accordance with the invention, a thermoelectric device, comprising a first metal foil having a first material thickness and a second metal foil having a second material thickness. The first metal foil and the second metal foil define an interspace therebetween. Electrical insulation coatings are disposed on the first metal foil and the second metal foil and face toward the interspace. A multiplicity of first semiconductor components and second semiconductor components are fixed in the interspace on the electrical insulation coatings and electrically connected to one another.

The thermoelectric device proposed herein specifies, in particular a layered or layer-like module for a thermoelectric apparatus or a thermoelectric generator. In this case, the semiconductor components are disposed between two metal foils. The term "metal foil" as used herein is intended to express, in particular, the fact that in this case a very thin metallic wall is provided for the thermoelectric device, in such a way that the heat transfer or the introduction of heat toward the semiconductor components is particularly favorable. Moreover, the thermoelectric device has a very thin or very flat construction, in such a way that in this case, too, particularly limited spaces can be utilized for integration into a motor vehicle. If appropriate, the first metal foil and the second metal foil can both fulfill different functions, in such a way that, for example, the first metal foil forms the so-called "hot side" and should accordingly be resistant to high temperatures. In contrast thereto, the second metal foil could form the "cold side", in which case it could, for example, also be more dimensionally stable (that is to say have a larger second material thickness) in order to withstand the pressure of the coolant flowing past there. Accordingly, it is preferred for the first metal foil and the second metal foil to be constructed separately.

The two metal foils form an interspace between them, e.g. in the manner of a sandwich. In this case, it is possible for the interspace to be delimited solely by the metal foils. However, this is not absolutely necessary. In this case, the interspace is preferably substantially not higher than the semiconductor components situated therein.

In order to realize a targeted current flow through the first semiconductor components and the second semiconductor components, it is proposed to provide the metallic foils at least partly with an electrical insulation coating, on which the semiconductor components are fixed and electrically connected to one another. In particular, at least one aluminum oxide layer is appropriate as an insulation coating. In this case, the coating thickness should be less than the first material thickness and/or the second material thickness of the metal foils, that is to say e.g. less than 300 μm (micrometers). In the case of the electrical insulation coating, care should be taken to ensure that it does not excessively impede the heat transfer from an outer side of the metal foil toward the semiconductor components. This can also be achieved, in particular, by the insulation coating actually only being provided in the region of contact points of the semiconductor components. In all cases, such an electrical insulation coating should be embodied in a sufficiently impermeable fashion in such a way that it is not permeable to the connecting device, in particular brazing or soldering material, with the result that electrically conductive connections toward the metal foil and/or adjacent current paths are reliably avoided through the use of the insulating coating.

In particular, p-doped and n-doped semiconductor materials are appropriate as conductive materials for thermocouples of thermoelements which are formed in this case with a multiplicity of first semiconductor components and second semiconductor components. In this case, bismuth tellurite ($Bi_2Te_3$) could be used. Furthermore, the following materials could be used [with the following temperature ranges in Kelvins]:

| | | |
|---|---|---|
| p-type: | $CsBi_4Te_6$: $SbI_3$ (0.005%) | [approx. 225 K]; |
| | $((Sb_2Te_3)_{72}Bi_2Te_3)_{25}(Sb_2Se_3)_3$ | [approx. 300 K]; |
| | $Tl_9BiTe_6$ | [approx. 500 K]; |
| | $GeTe_{1-x}(AgSbTe_2)_x$ | [approx. 700 K]; |
| n-type: | $Bi_{0.85}Sb_{0.15}$ | [approx. 80 K]; |
| | $(Sb_2Te_3)_5(Bi_2Te_3)_{90}(Sb_2Se_3)_5$ | [approx. 300 K]; |
| | $Bi_2Te_{2.7}Se_{0.3}$ | [approx. 450 K]; |
| | $Pb_{0.75}Sn_{0.25}Se$ | [approx. 800 K]. |

Therefore, in the case of this thermoelectric device, the two thin metal foils are utilized for delimiting the interspace and for a heat transfer toward the first semiconductor components and second semiconductor components. In this case, the first semiconductor components and second semiconductor components can be provided, for example, in the manner of small parallelepipeds and/or small elongate rods composed of material having different conductivities and can be brazed or soldered in. Two different semiconductor components are respectively electrically connected to one another in such a way that they produce a series circuit. One of the two metal foils absorbs the inflowing heat flow ("hot side") while the other metal foil emits the outflowing heat flow ("cold side").

With regard to the construction concerning the configuration and/or interconnection of the individual first semiconductor components and second semiconductor components, the type and/or shape and/or position of the first semiconductor components and/or second semiconductor components can be adapted to the structural space, the heat flow rate, the current conduction, etc., wherein they can, in particular, also differ in this case. The electrical connection of the first semiconductor components and second semiconductor components is, at least for a portion of the semiconductor components, preferably embodied alternately. Therefore, a series circuit formed by the different semiconductor components is provided, in particular. Nevertheless, alternatively or cumulatively, a parallel circuit can also be realized, in such a way that (at least a plurality of) semiconductor components of identical type are electrically connected to one another.

In accordance with another feature of the invention, particular preference is given to a configuration of the thermoelectric device wherein the first metal foil is a steel foil including the alloying constituents chromium and aluminum and having a first material thickness which is in the range of 30 μm to 300 μm. The steel foil including the alloying constituents chromium and aluminum as proposed herein is, in particular, resistant to high temperatures and corrosion-resistant to exhaust gases emerging from mobile internal combustion engines. In this respect, in particular, steel foils are also proposed herein such as are used in the treatment of exhaust gas with metallic honeycomb bodies. In this case, both metal foils having the following composition are preferred: approximately 18-25% by weight chromium, approximately 3-6% by weight aluminum, additions of titanium, yttrium and zirconium of between approximately 0.04 and 0.08% by weight and iron as a base. In principle, it could be expedient to embody the first metal foil with a first material thickness of up to 2 mm, for example, but preference is also given, in particular, to the range of 50 μm to 300 μm. In this case, it is simultaneously possible to provide a good heat transfer and secondly a sufficient stability for the thermoelectric device. The second material thickness of the second metal foil can be chosen independently of this, but should likewise not exceed 2 mm and should, in particular, be greater than the first material thickness.

In accordance with a further feature of the invention, with regard to the first metal foil, it can additionally be provided that the first metal foil has a catalyst carrier layer on an outer side facing away from the electrical insulation coating. That can have the effect, in particular, that the first metal foil through its outer side, comes directly into contact with the exhaust gases of an internal combustion engine. In particular, a zeolite layer and/or so-called washcoat are/is appropriate as the catalyst carrier layer. Moreover, it is possible for the catalyst carrier layer actually to include a catalyst, in particular noble metals, disposed in a manner distributed in and/or on the catalyst carrier layer. In the case of the layer height of the catalyst carrier layer, consideration should be given to ensuring that the latter does not significantly impede the heat transfer from the exhaust gas toward the semiconductor components in the interspace of the thermoelectric device. If appropriate, this can be compensated for by initiating exothermic reactions with the catalyst on the outer side, in such a way that additional heat can be liberated in this case on site.

In accordance with an added feature of the invention, it is also proposed that the multiplicity of first semiconductor components and second semiconductor components are electrically connected to one another through the use of brazing or soldering material on the insulation coating. In this case, it is preferred for the brazing or soldering points serving for fixing the semiconductor components substantially not to exceed the cross section or the contact area of the semiconductor components. Thus, in particular, brazing or soldering points having an area of, for example, between 0.8 mm² and 5 mm², and preferably between 1 mm² and 2 mm² (square millimeters), should be realized. The brazing or soldering material is preferably applied by an adhesive being printed onto the insulation coating at the desired locations, and the metal foil being brought into contact with pulverulant brazing or soldering material which adheres to these predefined adhesive locations. In this case, the granulation of the brazing or soldering material should be chosen in such a way that the amount of brazing material made available is precisely sufficient for the desired brazing or soldering location to be formed.

In accordance with an additional feature of the invention, it is advantageous for the multiplicity of first semiconductor components and second semiconductor components to have a component height of 1 mm to 5 mm (millimeters). This firstly leads to a very compact configuration of the thermoelectric device and secondly ensures a sufficient temperature difference between the first metal foil and the second metal foil across the interspace. A component height in the range of 1 to 2 mm is especially preferred. All of the semiconductor components will regularly have the same component height.

In accordance with yet another feature of the invention, the first metal foil and the second metal foil are directly connected to one another. In particular, brazing or soldering connections and/or welding connections are appropriate as direct connections. Care should be taken especially to ensure that the connection to one another is gas-tight, that is to say that, in particular, the penetration of exhaust gas and/or oxygen into the interspace is avoided. If appropriate, additional mechanical clamping devices and/or sealing devices can also be used for this purpose.

In accordance with yet a further feature of the invention, precisely in this context, it can also be expedient to embody the interspace with a filler medium that at least partly encloses the multiplicity of first semiconductor components and second semiconductor components. It is especially preferred for the filler medium to fill the entire interspace. By way of example, a potting compound, such as silicate, for example, is appropriate as the filler medium. Even if this variant is preferred, it is equally possible to realize other structural measures for avoiding contact between an exhaust gas and the semiconductor components, such as e.g. also a cap, a cover, a screen or the like.

In accordance with yet an added feature of the invention, it is also considered to be advantageous to have at least one layered construction. If appropriate, it is also possible for a portion of the first semiconductor components and second semiconductor components or it also possible for all of the semiconductor components, to be constructed in a layered manner. Since a particularly filigree thermoelectric device can be produced in this case, the layered application e.g. through the use of printing, of the material onto the metal foils can be realized particularly simply and process-reliably.

With the objects of the invention in view, there is furthermore provided a thermoelectric apparatus, comprising a multiplicity of thermoelectric devices according to the invention constructed as layered modules disposed opposite to one another. The first metal foils delimit hot channels and the second metal foils delimit cold channels.

The thermoelectric apparatus, then, in other words preferably includes a plurality of layers one above another, wherein the orientation of the devices alternates, in such a way that first metal foils delimit hot channels and second metal foils delimit cold channels, always in pairs. With regard to the channels, it is possible for only individual channels to be formed between the individual devices, but it is also possible to form a multiplicity of such channels, for example through the use of corresponding separating structures. It is also possible, in particular with regard to the cold channels, for the latter to be embodied with additional pipes.

With the objects of the invention in view, there is concomitantly provided a motor vehicle, comprising an internal combustion engine, an exhaust gas system, a water cooling circuit, and a thermoelectric apparatus according to the invention. The exhaust gas system is connected to the hot channels and the water cooling circuit is connected to the cold channels.

Other features which are considered as characteristic for the invention are set forth in the appended claims, noting that the features individually presented in the claims can be combined with one another in any technologically expedient manner and indicate further configurations of the invention.

Although the invention is illustrated and described herein as embodied in a thermoelectric device, a thermoelectric apparatus having a multiplicity of thermoelectric devices and a motor vehicle having a thermoelectric apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
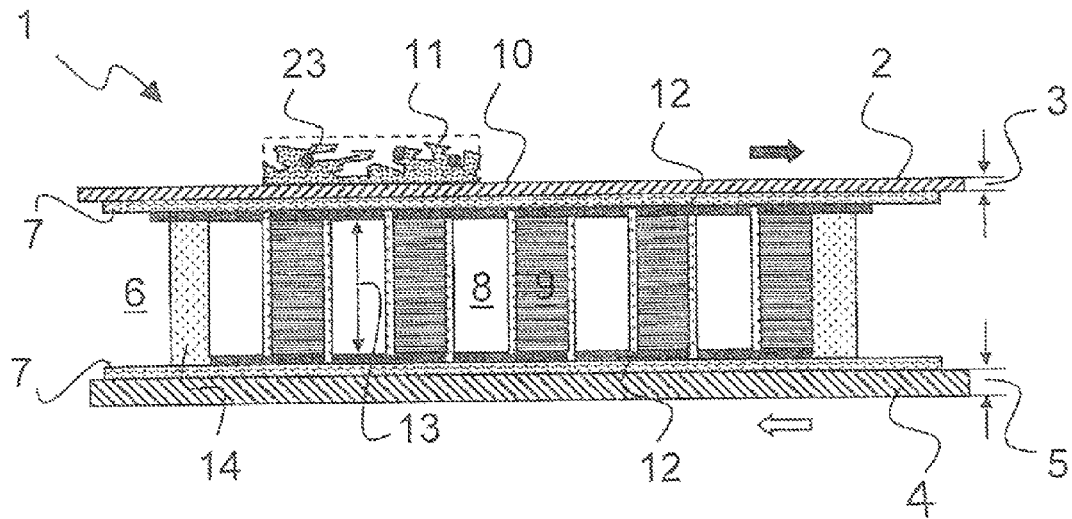
FIG. 1 is a fragmentary, diagrammatic, cross-sectional view of an embodiment variant of a thermoelectric device.

Referring now in detail to the figures of the drawing for explaining the invention and the technical field in more detail by showing particularly preferred structural variants to which the invention is not restricted, and first, particularly, to FIG. 1 thereof, there is seen an embodiment variant of a thermoelectric device 1. The thermoelectric device 1 has a hot side (identified by a black arrow) at the top and a cold side (identified by a white arrow) at the bottom.

The thermoelectric device 1 is delimited on the outside by a first metal foil 2 and a second metal foil 4. A fragmentary portion of a catalyst carrier layer 11 having a catalyst 23 is illustrated on an outer side 10 of the first metal foil 2. The first metal foil 2 is embodied with a first material thickness 3, which is very thin, for example in a range of 50 µm to 300 µm, in order to enable good thermal transfer toward an interspace 6 on the hot side. By contrast, the second metal foil 4 is embodied in this case with a larger second material thickness 5, for example in a range of 120 µm to 2 mm. Both the first metal foil 2 and the second metal foil 4 are provided in this case with an electrical insulation coating 7 facing toward the interior space 6.

Thermocouples are formed on the electrical insulation coatings 7. For this purpose, first (p-doped) semiconductor components 8 and second (n-doped) semiconductor components 9 are fixed and electrically connected to one another (alternately in series) through the use of brazing or soldering material 12 on the insulation coatings 7. In order to provide a particularly compact configuration, it is proposed that the first semiconductor components 8 and the semiconductor components 9 have a component height 13 of 1 mm to 5 mm. The interspace 6 has also a filler medium 14 disposed therein that at least partly encloses the multiplicity of first semiconductor components 8 and second semiconductor components 9.

Figure 2:
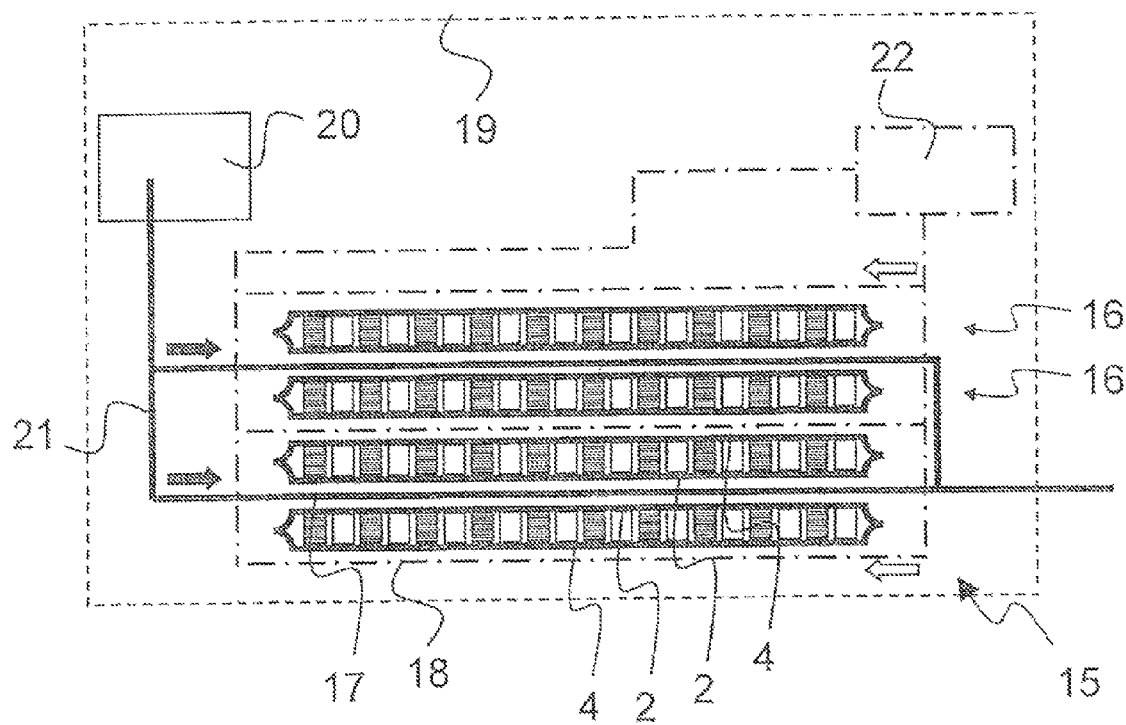
FIG. 2 is a plan view of a motor vehicle having an embodiment variant of a thermoelectric apparatus.

FIG. 2 is intended to diagrammatically illustrate the integration of the thermoelectric device 1 into a motor vehicle 19.

In this case, a thermoelectric apparatus 15 is formed with a plurality of the thermoelectric devices 1 in such a way that the thermoelectric devices 1 are embodied in the manner of layer modules 16 which are disposed in a layered manner with respect to one another. In this case, the layer modules 16 are disposed respectively opposite relative to one another, in such a way that the first metal foils 2 delimit hot channels 17 and the second metal foils 4 delimit cold channels 18. FIG. 2 also illustrates that hot exhaust gas generated in an internal combustion engine 20 flows along an exhaust gas system 21 and in the process is led through the hot channels 17 to the environment at the right side of the figure. In order to generate a large temperature difference between the hot side and the cold side of the thermoelectric device, the layer modules 16 are also brought into thermal contact on one side with cold water of a water cooling circuit 22. In this case, the water cooling circuit 22 is connected to the cold channels 18, wherein the water preferably flows in countercurrent with respect to the exhaust gas. It may also be seen that the first metal foil 2 and the second metal foil 4 of each module 16 are directly connected to one another at the ends.

The invention claimed is:

1. A thermoelectric device, comprising:
   a first metal foil having a first material thickness, said first material thickness being in a range of from 30 μm to 300 μm;
   a second metal foil having a second material thickness;
   said first metal foil and said second metal foil defining an interspace therebetween;
   electrical insulation coatings disposed on said first metal foil and said second metal foil and facing toward said interspace;
   said first metal foil having an outer side facing away from said electrical insulating coating and a catalyst carrier layer disposed on said outer side; and
   a multiplicity of first semiconductor components and second semiconductor components fixed in said interspace on said electrical insulation coatings and said multiplicity of first semiconductor components and second semiconductor components being electrically connected to one another only by brazing material disposed on said insulation coatings.

2. The thermoelectric device according to claim 1, wherein said first metal foil is a steel foil including chromium and aluminum alloying constituents.

3. The thermoelectric device according to claim 1, wherein said multiplicity of first semiconductor components and second semiconductor components each have a component height of 1 to 5 mm.

4. The thermoelectric device according to claim 1, wherein said first metal foil and said second metal foil are directly connected to one another.

5. The thermoelectric device according to claim 1, which further comprises a filler medium disposed in said interspace and at least partly enclosing said multiplicity of first semiconductor components and second semiconductor components.

6. The thermoelectric device according to claim 1, wherein at least a portion of said first semiconductor components or second semiconductor components has a layered construction.

7. A thermoelectric apparatus, comprising:
   a multiplicity of thermoelectric devices according to claim 1 constructed as layered modules disposed opposite to one another;
   said first metal foils of at least some of said layered modules defining hot channels therebetween; and
   said second metal foils of at least some of said layered modules defining cold channels therebetween.

8. A motor vehicle, comprising:
   an internal combustion engine;
   an exhaust gas system connected to said internal combustion engine;
   a water cooling circuit;
   a thermoelectric apparatus including a multiplicity of thermoelectric devices according to claim 1 constructed as layered modules disposed opposite to one another;
   said first metal foils of at least some of said layered modules defining hot channels therebetween;
   said second metal foils of at least some of said layered modules defining cold channels therebetween;
   said exhaust gas system being connected to said hot channels; and
   said water cooling circuit being connected to said cold channels.

* * * * *